US012653046B2

(12) United States Patent
Vodrahalli et al.

(10) Patent No.:  US 12,653,046 B2
(45) Date of Patent:      Jun. 9, 2026

(54) SEMICONDUCTOR DEVICE PACKAGE WITH DIE STACKUP AND INTERPOSER

(71) Applicant: SANDISK TECHNOLOGIES, INC., Milpitas, CA (US)

(72) Inventors: Nagesh Vodrahalli, Los Altos, CA (US); Chih-Yang Li, Menlo Park, CA (US); Shrikar Bhagath, San Jose, CA (US); Narayanan Terizhandur V, Bothell, WA (US)

(73) Assignee: SANDISK TECHNOLOGIES, INC., Milipitas (CA)

( * ) Notice: Subject to any disclaimer, the term of this patent is extended or adjusted under 35 U.S.C. 154(b) by 319 days.

(21) Appl. No.: 18/361,168

(22) Filed: Jul. 28, 2023

(65) Prior Publication Data

US 2024/0312916 A1      Sep. 19, 2024

Related U.S. Application Data

(60) Provisional application No. 63/490,659, filed on Mar. 16, 2023.

(51) Int. Cl.
| | |
|---|---|
| *H10W 70/60* | (2026.01) |
| *H10W 70/63* | (2026.01) |
| *H10W 90/00* | (2026.01) |
| *H10W 42/20* | (2026.01) |

(Continued)

(52) U.S. Cl.
CPC ........ *H10W 70/611* (2026.01); *H10W 70/635* (2026.01); *H10W 90/00* (2026.01); *H10W 90/701* (2026.01); *H10W 42/271* (2026.01);

*H10W 72/5445* (2026.01); *H10W 90/24* (2026.01); *H10W 90/752* (2026.01); *H10W 90/754* (2026.01); *H10W 90/755* (2026.01)

(58) Field of Classification Search
CPC ........... H01L 23/5384; H01L 23/49816; H01L 24/48; H10W 70/611
See application file for complete search history.

(56) References Cited

U.S. PATENT DOCUMENTS

| | | | |
|---|---|---|---|
| 11,189,582 B2 | 11/2021 | Yang et al. | |
| 11,315,905 B2 | 4/2022 | Park | |
| 12,347,810 B2 | 7/2025 | Zhang et al. | |

(Continued)

FOREIGN PATENT DOCUMENTS

| | | |
|---|---|---|
| JP | 2009141312 A | 6/2009 |
| WO | 2019212623 A1 | 11/2019 |

*Primary Examiner* — Errol V Fernandes
(74) *Attorney, Agent, or Firm* — Morgan, Lewis & Bockius LLP

(57) ABSTRACT

A semiconductor device package includes a substrate, a stack of memory dies positioned on the substrate, and an interposer spaced from the stack of memory dies and also positioned on the substrate. First and second sets of bond pads are electrically connected to the substrate, where the second set of bond pads is positioned on the interposer above the substrate. A first set of bond wires electrically connects a first sub-stack of the memory dies to the first set of bond pads. A second set of bond wires electrically connects a second sub-stack of memory dies, positioned above the first sub-stack, to the second set of bond wires. The first and second sub-stacks of memory dies may be electrically isolated from one another to reduce noise in electrical signals transmitted to and from the memory dies.

18 Claims, 4 Drawing Sheets

(51) Int. Cl.
    *H10W 72/50*        (2026.01)
    *H10W 90/24*        (2026.01)

(56)                  References Cited

U.S. PATENT DOCUMENTS

| | | | |
|---|---|---|---|
| 2010/0320584 A1 | 12/2010 | Takano | |
| 2012/0153471 A1 | 6/2012 | Watanabe | |
| 2013/0228867 A1 | 9/2013 | Suematsu | |
| 2014/0183727 A1 | 7/2014 | Lu | |
| 2014/0339290 A1 | 11/2014 | Han | |
| 2017/0309597 A1 | 10/2017 | Chuang | |
| 2018/0026022 A1 | 1/2018 | Lee | |
| 2018/0211943 A1 | 7/2018 | Song | |
| 2018/0366441 A1 | 12/2018 | Lai | |
| 2020/0251447 A1 | 8/2020 | Kang | |
| 2022/0052015 A1 | 2/2022 | Hasegawa | |
| 2022/0199580 A1 | 6/2022 | Hom | |
| 2022/0285320 A1 | 9/2022 | Sano | |
| 2022/0375901 A1 | 11/2022 | Yamamoto | |
| 2022/0392866 A1 | 12/2022 | Park | |
| 2023/0069208 A1* | 3/2023 | Lee | H10W 90/00 |
| 2023/0069476 A1* | 3/2023 | Boo | H01L 25/50 |
| 2024/0387461 A1 | 11/2024 | India et al. | |

* cited by examiner

SEMICONDUCTOR DEVICE PACKAGE WITH DIE STACKUP AND INTERPOSER

CROSS-REFERENCE TO RELATED APPLICATIONS

This application claims the benefit of U.S. Provisional Patent Application No. 63/490,659 filed Mar. 16, 2023 entitled "Semiconductor Device Package with Die Stackup and Interposer", which is incorporated by reference herein in its entirety.

BACKGROUND

The present disclosure generally relates to semiconductor device packages having a stack of memory dies and, more particularly, to a semiconductor device package including a die stackup and an interposer for routing electrical signals to the die stackup.

A semiconductor memory package may include a plurality of semiconductor memory dies and a controller packaged together on a substrate and encapsulated in a molding compound. The memory dies may be disposed in a die stack, with the memory dies in the stack being electrically coupled to the substrate with respective pluralities of bonding wires. The memory dies in the die stack may be characterized as forming different sub-stacks such as a first sub-stack (e.g., a first channel) of memory dies and a second sub-stack (e.g., a second channel) of memory dies. The substrate includes communication lines that route electrical signals (e.g., power, ground, input/output (IO) signals) between the bonding wires and the controller and to external connections. Conventionally, continuous bonding wires directly connected to the substrate transmit power and ground signals to each memory die included in a die stack. This often includes continuous bond wires that electrically connect the first and second channel memory dies to one another. However, this often increases unwanted disturbances in the electrical signals, commonly referred to as noise, transmitted to and from the memory dies. Additionally, as pitch between adjacent bond pads on the memory dies decreases, the risk of electrical shorts occurring due to bond wires contacting one another is increased as well. Therefore, there is a need to provide semiconductor device packages configured to reduce the noise in electrical signals transmitted to and from memory dies in die stacks included therein and to reduce the risk of electrical shorts.

SUMMARY

In one embodiment there is a semiconductor device package including a substrate having a first set of bond pads electrically connected thereto, a stack of semiconductor dies including a first sub-stack of dies and a second sub-stack of dies, the second sub-stack of dies positioned above the first sub-stack of dies, an interposer positioned on the substrate and spaced from the stack of semiconductor dies, a second set of bond pads positioned on the interposer and electrically connected to the substrate by way of the interposer, wherein the second set of bond pads are positioned above the substrate, a first set of bond wires electrically connecting the first sub-stack of dies to the first set of bond pads, and a second set of bond wires electrically connecting the second sub-stack of dies to the second set of bond pads.

In some embodiments, the stacked semiconductor dies comprise memory dies, and the first sub-stack of memory dies and second sub-stack of memory dies are electrically isolated from one another. In some embodiments, the first set of bond pads is positioned on the substrate between the stack of semiconductor dies and the interposer. In some embodiments, the second set of bond pads are positioned above a top surface of the substrate by a height of at least 50 microns. In some embodiments, a height of the interposer is at least five times a diameter of bond wires included in the first or second sets of bond wires. In some embodiments, at least a portion of the second set of bond wires is positioned vertically above the first set of bond wires and does not directly contact the first set of bond wires.

In some embodiments, the interposer is comprised of a dielectric material. In some embodiments, the second set of bond pads is electrically connected to the substrate by a through-device via in the interposer. In some embodiments, the semiconductor device package further includes one or more solder balls physically coupling the interposer to the substrate and electrically connecting the through-device via to the substrate. In some embodiments, the substrate includes a third set of bond pads, the interposer is positioned between the first and third sets of bond pads, and the semiconductor device package further comprises a third set of bond wires electrically connecting to the second set of bond pads to the third set of bond pads. In some embodiments, the interposer is mounted directly on the substrate. In some embodiments, each semiconductor die included in the stack of semiconductor dies includes a set of die bond pads, the die bond pads of the first sub-stack of dies are electrically connected to the first set of bond pads by the first set of bond wires, and the die bond pads of the second sub-stack of dies are electrically connected to the second set of bond pads by the second set of bond wires.

In another embodiment, there is a semiconductor device package including a substrate including a top surface and a first set of bond pads exposed at the top surface, an interposer positioned on and extending upwardly from the top surface of the substrate, the interposer including a second set of bond pads coupled to a top surface of the interposer, a stack of staggered memory dies offset with respect to each other in a longitudinal direction and including a bottom sub-stack of memory dies and an upper sub-stack of memory dies, a first plurality of bond wires electrically connecting the bottom sub-stack of memory dies to the first set of bond pads, and a second plurality of bond wires electrically connecting the upper sub-stack of memory dies to the second set of bond pads, and the bottom sub-stack of memory dies are not electrically connected to the second set of bond pads and the top sub-stack of memory dies are not electrically connected to the first set of bond pads.

In some embodiments, the first set of bond pads are positioned on the substrate between the stack of staggered memory dies and the interposer. In some embodiments, the top surface of the interposer is offset from the top surface of the substrate by a height of at least 50 microns as measured in a direction generally perpendicular to the top surface of the substrate. In some embodiments, the top surface of the interposer is positioned between the top surface of the substrate and a top surface of an uppermost memory die included in the stack of staggered memory dies. In some embodiments, each memory die included in the stack of staggered memory dies has a set of die bond pads, the die bond pads of the first sub-stack of memory dies are electrically connected to the first set of bond pads by the first plurality of bond wires, and the die bond pads of the second sub-stack of memory dies are electrically connected to the second set of bond pads by the second plurality of bond wires.

In some embodiments, the semiconductor device package further includes one or more solder balls physically coupling the interposer to the substrate, wherein the one or more solder balls are electrically connected to the substrate, and a through-device via extending through the interposer and electrically connecting the second set of bond pads to the one or more solder balls. In some embodiments, the semiconductor device package further includes a third set of bond pads exposed at the top surface of the substrate, the interposer is positioned between the first and third sets of bond pads, and a third plurality of bond wires electrically connected to the second plurality of bond wires and the third set of bond pads, and the interposer is mounted directly on the substrate.

In another embodiment there is a semiconductor device package including a substrate means for providing electrical interconnections between electrical components coupled to the substrate means, the substrate means including a first set of electrical contact means for transmitting and receiving a plurality of electrical signals, and a stack of storage means each for storing an amount of data, the stack of storage means including a first sub-stack of storage means and a second sub-stack of storage means positioned above the first sub-stack of storage means. The semiconductor device package includes an interposer means for conveying electrical signals between the second sub-stack of storage means and the substrate means, the interposer means positioned on the substrate means and spaced from the stack of storage means. The semiconductor device package includes a second set of electrical contact means for transmitting and receiving a plurality of electrical signals, the second set of electrical contact means being positioned on the interposer means and separated from the substrate means by a height of the interposer means, a first set of electrical connection means for electrically connecting the first sub-stack of storage means to the first set of electrical contact means, the first set of electrical connection means electrically connected to the first sub-stack of storage means and to the first set of electrical contact means, and a second set of electrical connection means for electrically connecting the second sub-stack of storage means to the second set of electrical contact means, the second set of electrical connection means electrically connected to the second sub-stack of storage means and to the second set of electrical contact means. The first sub-stack of storage means and the second sub-stack of storage means are electrically isolated from one another.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments, which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

In the drawings.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Numerous details are described herein in order to provide a thorough understanding of the example embodiments illustrated in the accompanying drawings. However, some embodiments may be practiced without any of the specific details, and the scope of the claims is only limited by those features and aspects specifically recited in the claims. Furthermore, well-known methods, components, and circuits have not be described in exhaustive detail so as not to unnecessarily obscure pertinent aspects of the embodiments described herein.

Figure 1:
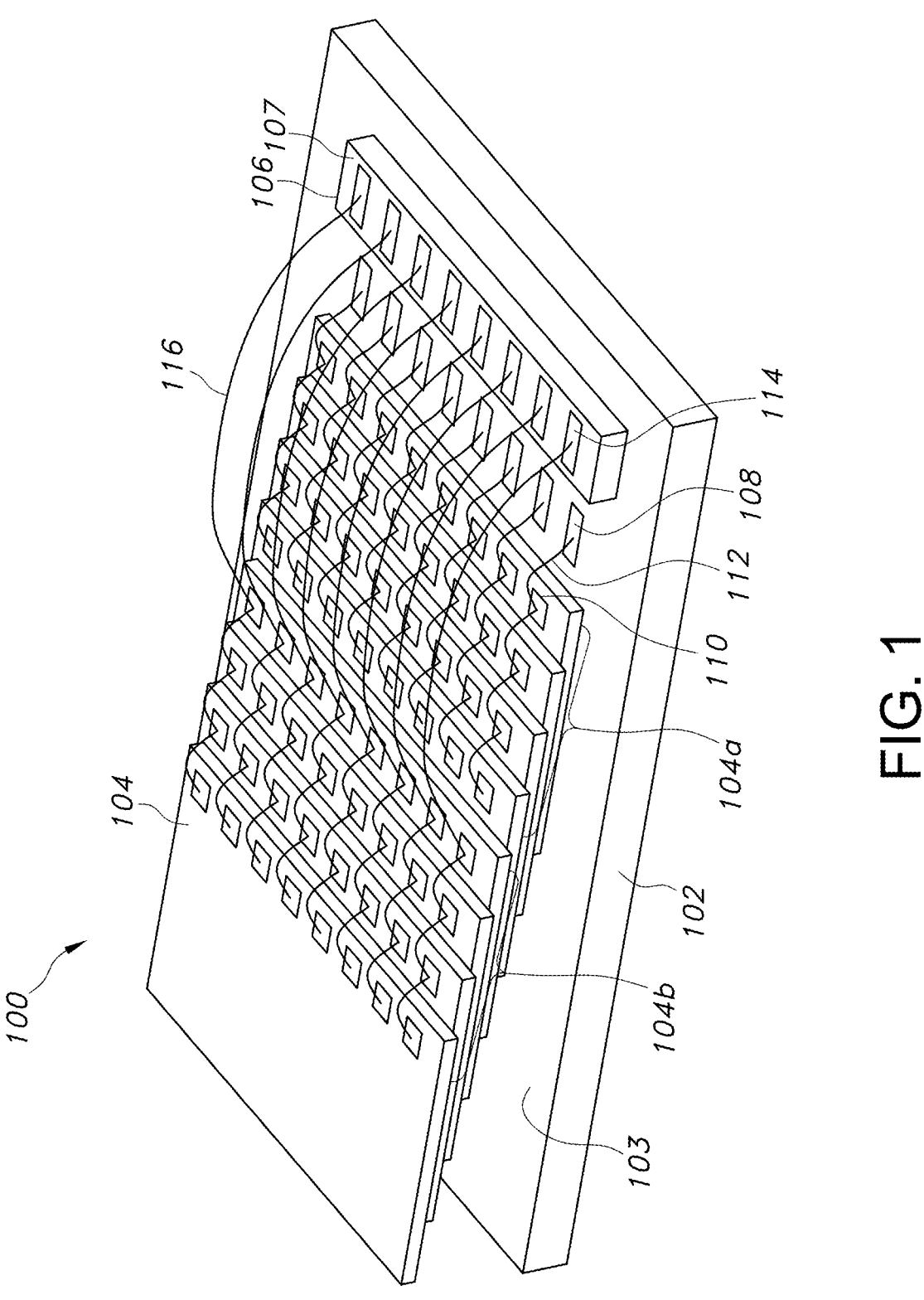
FIG. 1 is a perspective view of a portion of a semiconductor device package with a die stack and interposer in accordance with an exemplary embodiment of the present disclosure.
Figures 2A, 2B:
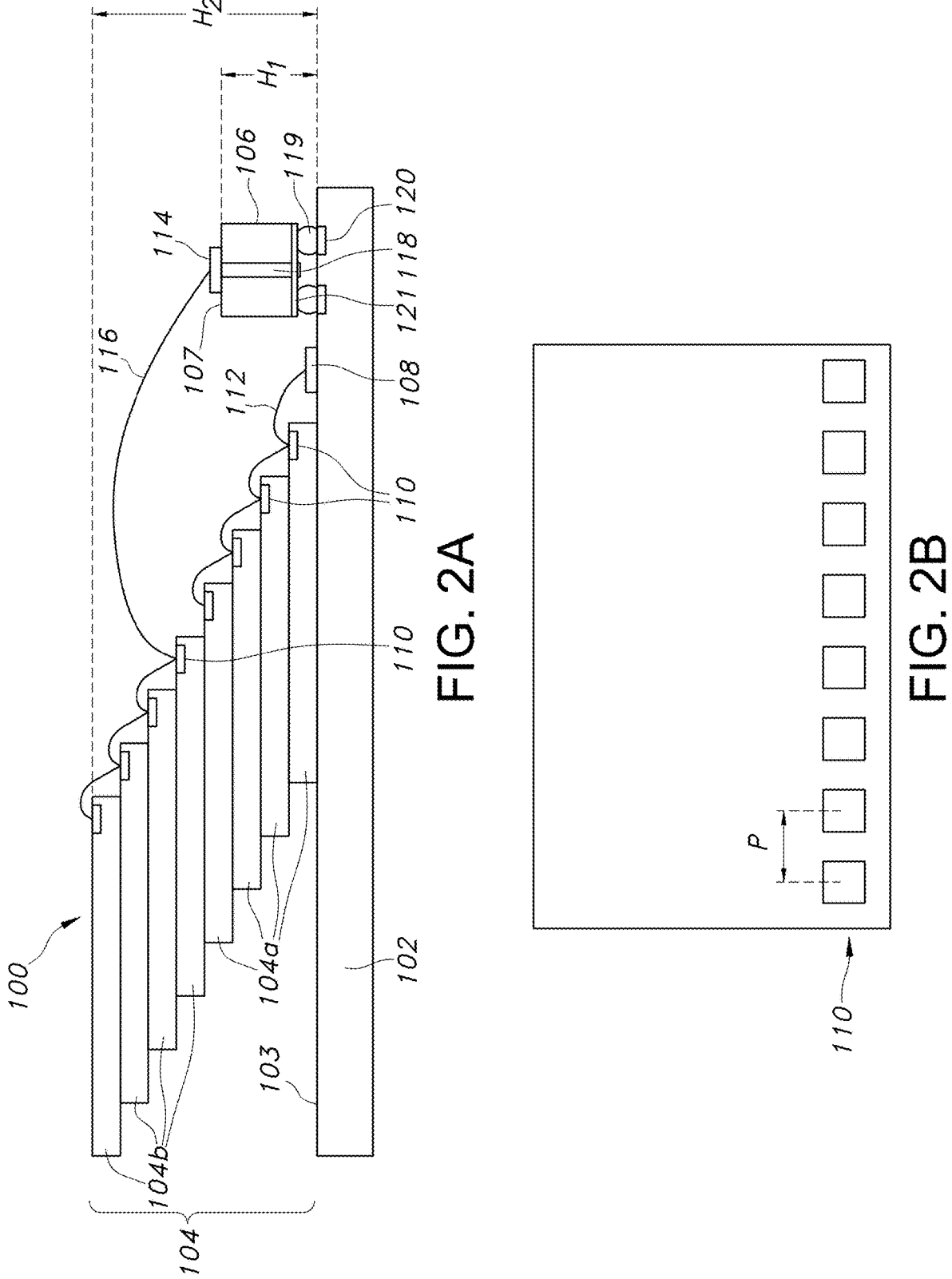
FIG. 2A is a side cross-sectional view of the portion of the semiconductor device package of FIG. 1.
FIG. 2B is a top plan view of a memory die included in the die stack of the semiconductor device package of FIG. 1.

Referring to FIGS. 1-2B, there is shown a portion of a semiconductor device package, generally designated 100, in accordance with an exemplary embodiment of the present disclosure. The semiconductor device package 100, or package 100 for short, may include a substrate 102, a stack of memory dies 104, and an interposer 106. The package 100 may be any type of semiconductor device package, such as, but not limited to, a system-in-package (SiP), a storage device (e.g., a secure digital (SD) card or a MultiMediaCard (MMC)). The memory dies included in the stack of memory dies 104 may be NAND memory dies. The memory dies included in the stack 104 may generally be storage means configured to store an amount of electrical charge (e.g., provide a data storage amount). In some embodiments, the package 100 may include a controller (not shown) configured to control the routing of signals (e.g., power, ground, IO signals) to and from the memory dies included in the stack 104. In some embodiments, the controller may be an application-specific integrated circuit (ASIC), or any other type of controller. The controller may be electrically connected to the substrate 102. In some embodiments, a mold compound (not shown) may encapsulate at least the die stack 104 and interposer 106. The mold compound may include, for example, an epoxy molding compound (EMC) or other encapsulant material known in the art.

The substrate 102 may be a mechanical base support of package 100 and/or an electrical interface that provides access to the stack of memory dies 104 housed within the package. The electrical interface may include a plurality of metal layers within the substrate 102, including at least one layer for routing data using conductive (e.g., copper) traces, a ground layer, and/or a power layer. In some embodiments, there is a first set of bond pads 108 electrically connected to the substrate 102. The first set of bond pads 108 may be electrically connected to the electrical interface of the substrate 102. As such, the first set of bond pads 108 may act as a first set of electrical contact means for transmitting and receiving a plurality of electrical signals. In some embodiments, the first set of bond pads 108 is electrically connected to the substrate 102 and mounted directly on a top surface 103 of the substrate 102. In some embodiments, the first set of bond pads 108 are positioned between the interposer 106 and the stack of memory dies 104. In some embodiments, there are a plurality of bond pads included in the first set of bond pads 108. In some embodiments, the bond pads included in the first set of bond pads 108 may be generally aligned with one another in at least one direction. For example, the bond pads of the first set of bond pads 108 may be arranged along a generally straight line or single column. In some such configurations, the centers of each of the bond pads in the first set may be substantially co-linear.

The stack of memory dies 104 may include a first sub-stack of memory dies 104a and a second sub-stack of memory dies 104b. The first sub-stack and second sub-stack 104a-104b of memory dies may alternatively be referred to as a first memory channel 104a and a second memory channel 104b. The second sub-stack of memory dies 104b may be positioned above and on the first sub-stack of memory dies 104a. For example, the bottom most memory die included in the second sub-stack of memory dies 104b may be mounted directly on the upper most memory die included in the first sub-stack of memory dies 104a. As such, the first sub-stack 104a may alternatively be referred to as a bottom sub-stack and the second sub-stack 104b may alternatively be referred to as an upper sub-stack. In some embodiments, each of the first and second sub-stack of memory dies 104a, 104b includes generally the same number of memory dies. For example, and as illustrated in FIGS. 1-2B, each sub-stack 104a, 104b includes four memory dies. However, it should be understood that each sub-stack 104a, 104b may include fewer than, or more than four memory dies. For example, one or more of the sub-stacks 104a, 104b may include between one to sixteen memory dies. In some embodiments, the sub-stacks 104a, 104b may each include a different number of memory dies. For example, the first sub-stack 104a may include eight memory dies and the second sub-stack 104b may include four memory dies.

In some embodiments, one or more of the memory dies included in the stack 104 may include a corresponding set of die bond pads 110 to allow for electrical signals to be transmitted to and from the corresponding memory die. Each of the memory dies included in the first and second sub-stacks 104a, 104b may include a set of die bond pads 110. In some embodiments, the number of die bond pads included in each set of die bond pads 110 is equal to the number of bond pads included in the first set of bond pads 108. Each of the die bond pads included in a set of die bond pads 110 may be exposed at a top surface of the corresponding memory die. In some embodiments, each die bond pad included in a set of die bond pads 110 is generally the same size. For example, the die bond pads may define a footprint at the top surface of the corresponding memory die of about 60 microns by about 70 microns (e.g., a length of about 60 microns, a width of about 70 microns). In some embodiments, the sets of die bond pads 110 are generally flush with a top planar surface of the corresponding memory die. In other embodiments, the sets of die bond pads 110 extend partially above the top planar surface of the corresponding memory die.

In some embodiments, the sets of die bond pads 110 are offset from one another in a transverse direction by a pitch distance P (shown in FIG. 2B), alternatively referred to as pitch P. For example, each die bond pad included in a set of die bond pads 110 is offset from adjacent die bond pads by the pitch P. As such, the pitch P may define a transverse distance between the center a die bond pad to the corresponding center of an adjacent die bond pads. For example, the pitch P may define the center-to-center distance between adjacent die bond pads included in a set of die bond pads 110. In some embodiments, pitch P may be considered the distance from the center of one bond pad to the center of the next adjacent bond pad in the set. In some embodiments, the pitch P is about 80 microns. In some embodiments, the pitch P may be between about 150 microns to about 60 microns. In some embodiments, the pitch P is less than or equal to about 80 microns.

In some embodiments, each memory die included in the stack 104 are offset from an adjacent memory die in the longitudinal direction. For example, the stack 104 may be a stack of staggered memory dies and the memory dies included in the stack 104 form a staircase like pattern in which a sidewall of each memory die is offset from a corresponding sidewall of an adjacent memory die. As such, each memory die included in the stack 104 may have an exposed top surface that is not covered by an adjacent memory die where the corresponding set of die bond pads 110 is positioned.

The package 100 may include a first set of bond wires 112 for electrically connecting the first sub-stack 104a to the substrate 102. The first set of bond wires 112 may electrically connect the first sub-stack of memory dies 104a to the first set of bond pads 108. The first set of bond wires 112 may be electrically connected to each memory die included in the first sub-stack of memory dies 104a. In some embodiments, one or more of the bond wires included in the first set of bond wires 112 may transmit power and ground signals from the substrate 102 to the first sub-stack of memory dies 104a. In some embodiments, the bond wires included in the first set of bond wires 112 are comprised of an electrically conductive material (e.g., copper, silver, gold, aluminum). The bond wires included in the first set of bond wires 112 may have a diameter of about eighteen microns. In some embodiments, the diameter of the bond wires included in the first set of bond wires 112 may be between about fifteen microns to twenty-five microns.

In some embodiments, the interposer 106 is positioned on the substrate 102 and spaced from the stack of memory dies 104. For example, the interposer 106 may be spaced from the first set of bond pads 108 and positioned on the substrate 102 opposite the stack of memory dies 104. The interposer 106 may extend upwardly from the substrate 102 by a height $H_1$. For example, a top planar surface 107 of the interposer 106 may be offset from the top planar surface 103 of the substrate 102 by a height $H_1$. In some embodiments, the height $H_1$ is at least 50 microns. In some embodiments, the height $H_1$ is less than or equal to a height $H_2$ of the stack of memory dies 104. The height $H_2$ of the stack of memory dies 104 may be defined by the distance between the top surface of the uppermost memory die included in the stack 104 and the top surface 103 of the substrate 102, as measured in a direction generally perpendicular to the top surface 103. As such, the height $H_1$ may be less than or equal to height $H_2$. In some embodiments, the height $H_1$ of the interposer 106 is at least five times a diameter of the bond wires included in the first set of bond wires 112 and/or second set of bond wires 116 (discussed in more detail below). For example, in an instance where the diameter of the bond wires included in the first set of bond wires 112 is about eighteen microns, the height $H_1$ may be about 90 microns. In some embodiments, the height $H_1$ may be less than or about equal to the height of the first sub-stack 104*a* of memory dies. In other embodiments, the height $H_1$ may be greater than the height of the first sub-stack 104*a* and less than the height $H_2$.

In some embodiments, the top planar surface 107 of the interposer 106 is positioned below a top surface of the first sub-stack of memory dies 104*a*. The top surface of the first sub-stack of memory dies 104*a* may be defined by the top surface of the uppermost memory die included in the first sub-stack 104*a*. In some embodiments, the top planar surface 107 of the interposer 106 is positioned between the top surface of the first sub-stack 104*a* and the top surface of the second sub-stack 104*b*. In some embodiments, the interposer 106 is comprised of at least one of silicon and ceramic. In some embodiments, the interposer 106 is comprised of a non-conductive material.

In some embodiments, the semiconductor device package 100 includes a second set of bond pads 114 electrically connected to the substrate 102 and positioned on the interposer 106. The second set of bond pads 114 may act as a second set of electrical contact means for transmitting and receiving a plurality of electrical signals. In some embodiments, the second set of bond pads 114 are substantially the same as the first set of bond pads 112 except that they are positioned on the interposer 106. In some embodiments, the second set of bond pads 114 are the only bond pads on the interposer 106. The number of bond pads included in the second set of bond pads 114 may be generally the same as the number of bond pads included in the first set of bond pads 112. The second set of bond pads 114 may be positioned above the substrate 102. In some embodiments, the second set of bond pads 114 are positioned on the top planar surface 107 of the interposer 106. As such, the second set of bond pads 114 may be spaced from the substrate 102 by the height $H_1$ of the interposer 106. The bond pads included in the second set of bond pads 114 may be generally aligned with one another in at least one direction. For example, the bond pads of the second set of bond pads 114 may be arranged along a generally straight line or single column. In some such configurations, the centers of each of the bond pads in the second set may be substantially co-linear. The interposer 106 may have a generally rectangular cuboid shape, as shown in FIGS. 1-2A. However, it should be understood that the interposer 106 may have any other shape suitable for providing an elevated mounting surface (e.g., top planar surface 107) upon which the second set of bond pads 114 may be positioned.

In some embodiments, the second set of bond pads 114 is electrically connected to the substrate 102 by a through-device via 118. For example, there may be one or more through-device vias 118 coupled to the interposer 106 that electrically connects the substrate 102 to the second set of bond pads 114. In some embodiments, the through-device via 118 is a through-silicon via (TSV). In some embodiments, each bond pad in the second set of bond pads 114 is electrically connected to a separate through-device via 118 that extends through the interposer 106. The interposer 106 may include one or more vertical openings or apertures extending from the top surface 107 of the interposer 106 to the bottom surface of the interposer 106 such that the through-device vias 118 may be positioned therein. Each through-device via 118 may include an electrically conductive layer (e.g., a copper layer) that is plated along on the inner surfaces of the one or more openings or apertures to form an electrical pathway from the top surface 107 of the interposer 106 to the bottom surface of the interposer 106. Each bond pad of the second set of bonds 114, in some embodiments, may be in direct contact with the electrically conductive layer of a through-device via 118 at the top surface 107 of the interposer 106. In some embodiments, each through-device via 118 is electrically connected to the substrate 102 by one or more solder balls 119 that are electrically connected to corresponding bond pads 120 of the substrate 102. In some embodiments, each through-device via 118 is electrically connected to two or more solder balls 119 that are electrically connected to corresponding bond pads 120 of the substrate 102. Solder balls 119, in some embodiments, are positioned between the bottom surface of the interposer 106 and substrate 102. In some embodiments, an electrically conductive layer or plate 121 may be disposed between the solder balls 119 and the bottom surface of the interposer 106 which electrically connects the solder balls 119 with a through-device via 118. The solder balls 119 may physically couple the interposer 106 to the substrate 102 and electrically connect the through-device via 118 to the substrate 102. As such, a bottom surface of the interposer 106 may be spaced from the top planar surface 103 of the substrate 102 by the solder balls 119. The second set of bond pads 114 may be positioned on the interposer 106 opposite the solder balls 119. In some embodiments, there are at least two solder balls 119 for each bond pad included in the second set of bond pads 114. In some embodiments, the interposer 106 may be a passive structure that is not configured to generate, transmit, control and/or store any electrical current or signals therein. In some embodiments, interposer 106 may comprise a monolithic structure formed from a single material, e.g., a ceramic or silicon, through which the through-device vias 118 extend. The interposer 106 may be comprised of an electrically insulating material, for example a dielectric material, such that electrical current conducted through the through-device via 118 is not conducted through the material of the interposer 106. The interposer 106 may be configured to act as a dielectric medium such that the via 118, the solder balls 119 and/or the second set of bond pads 114 are electrically isolated from the interposer 106. The interposer 106 may not receive any electrical power, ground, and/or IO signals from, for example, the substrate 102. Instead, the interposer 106 may be configured to serve as a passive structure for mounting the second set of bond pads 114 thereto and to space the second set of bond pads 114 from the top surface 103 of the substrate 102. Similarly, the interposer 106 may be configured to act as a mechanical support for the through-device via 118 such that the through-device via 118 and second set of bond pads 114 may be electrically connected to one another.

In some embodiments, the semiconductor device package 100 includes a second set of bond wires 116 for electrically connecting the second sub-stack of memory dies 104*b* to the second set of bond pads 114. The second set of bond wires 116 may be generally the same as the first set of bond wires 114 except that the second set of bond wires 116 are directly connected to the second sub-stack 104*b* and the second set of bond pads 114. In some embodiments, the second set of bond wires 116 are electrically connected to the die bond pads 110 of the memory dies included in the second sub-stack 104*b*. In this manner, electrical signals (e.g., power, ground, IO signals) may be transmitted between the substrate 102 and second sub-stack 104*b* via the second set of bond wires 116. In some embodiments, the die bond pads 110 included in the first sub-stack 104*a* are not electrically connected to the second set of bond pads 114. The die bond pads 110 included in the second sub-stack 104*b* may not be electrically connected to the first set of bond pads 108.

In some embodiments, by electrically connecting the second set of bond wires 116 to the second set of bond pads 114 that are positioned above the substrate 102, the risk of an electrical short occurring with the first and second sets of bond wires 112, 116 may be reduced. For example, the first set of bond wires 112 may not directly contact the second set of bond wires 116. The interposer 106 may provide an elevated surface that the second set of bond pads 114 may be positioned on. As such, the second set of bond wires 116 may extend between the die bond pads 110 of the second sub-stack 104*b* and the second set of bond pads 114 positioned above the substrate 102. In this manner, the interposer 106 and/or second set of bond pads 114 may be configured to position the second set of bond wires 116 substantially above the first set of bond wires 114 to prevent, or at least reduce the risk of, an electrical short occurring between the first and second set of bond wires 116.

Furthermore, by providing the interposer 106 and second set of bond pads 114 as discussed herein, the amount of space (e.g., vertical space or separation) between bond wires connecting different sub-stacks of dies may be increased when compared to conventional packages. The interposer 106 and second set of bond pads 114 may aid in preventing the first and second sets of bond wires 112, 116 from directly contacting one another regardless of the pitch P between die bond pads 110. For example, as the pitch between die bond pads and/or memory dies decreases, it may become increasingly difficult to connect bond wires in a manner that would electrically isolate different sub-stacks from one another. As such, by providing the interposer 106 and second set of die bond pads 114 of the present disclosure the second set of bond wires 116 may be easily spaced from the first set of bond wires 112 in instances where the pitch P is equal to or less than, for example, about 80 microns. In some embodiments, the first set of bond pads 108 are electrically isolated from the second set of bond pads 114. For example, in some embodiments, there are no bond wires that extend from the first set of bond pads 108 to the second set of bond pads 114. In some embodiments, there are no bond wires that extend from the first set of bond pads 108 to the interposer 106. In some embodiments, no bond wires of the first set of bond wires 112 are connected to bond pads on the interposer 106. As such, in some embodiments, none of the memory dies of the first sub-stack 104*a* are electrically connected to the second set of bond pads 114. In some embodiments, none of the memory dies of the second substack 104*b* are electrically connected to the first set of bond pads 108.

In some embodiments, the first sub-stack of memory dies 104*a* and second sub-stack of memory dies 104*b* are electrically isolated from one another. For example, electrical signals transmitted between the first sub-stack 104*a* and substrate 102 may be electrically isolated from electrical signals transmitted between the second sub-stack 104*b* and substrate 102. As such, in some embodiments, the first sub-stack 104*a* and second sub-stack 104*b* are electrically isolated from one another, or electrically separated from one another, on the stack of memory dies 104. The first and second sub-stacks 104*a*, 104*b* may be different memory channels (e.g., a first memory channel 104*a* and second memory channel 104*b*) electrically isolated from one another. In some embodiments, the first sub-stack 104*a* and second sub-stack 104*b* being electrically isolated from one another includes power and ground signals transmitted to and from each of the sub-stacks 104*a*, 104*b* being electrically isolated from one another. By electrically isolating the power and ground signals transmitted between the substrate 102 and the respective sub-stacks 104*a*, 104*b*, signal noise may be reduced when compared to conventional packages 100 in which the power and ground signals transmitted to a stack of memory dies is not electrically isolated.

Figure 3:
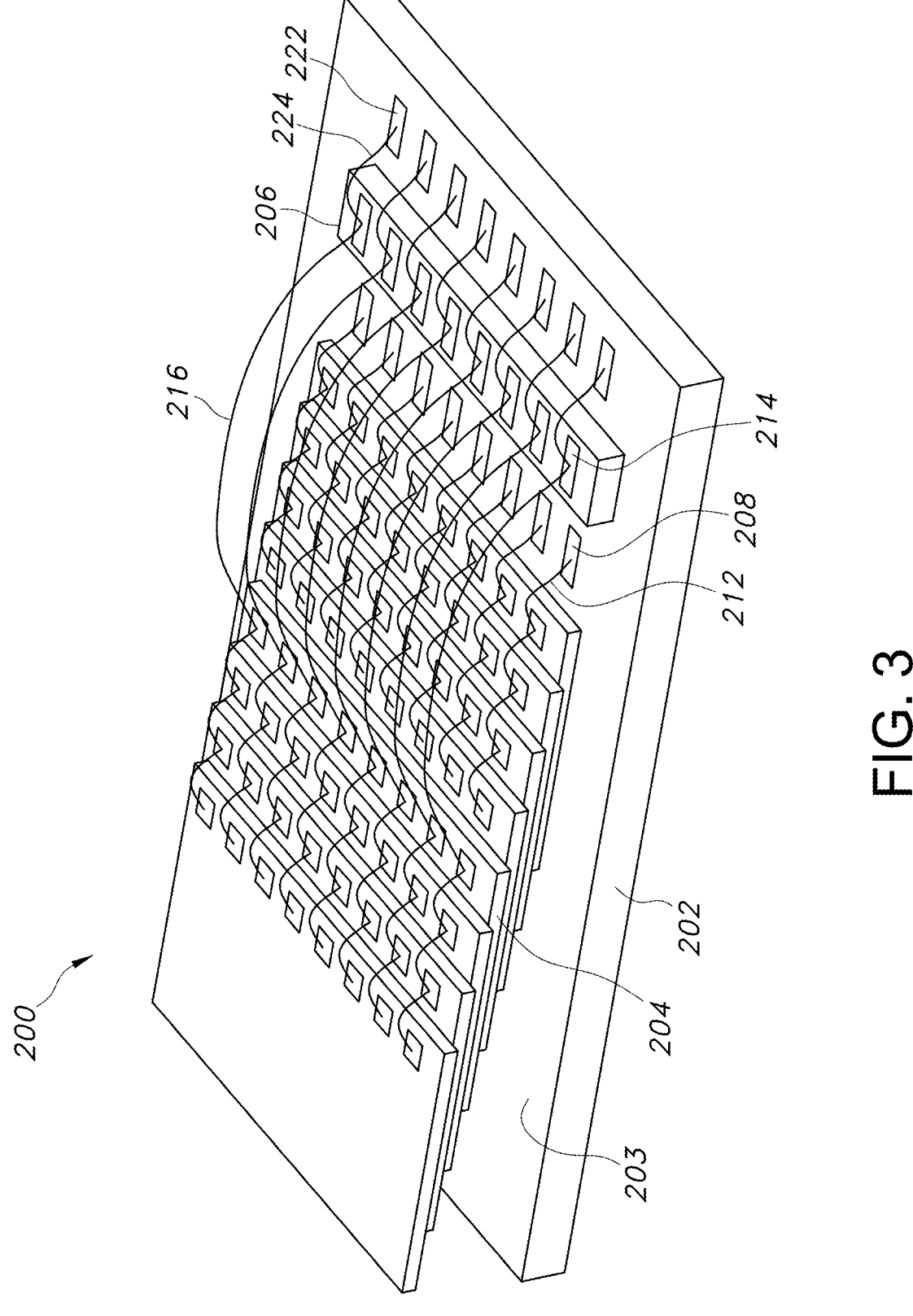
FIG. 3 is a perspective view of a portion of a semiconductor device package with die stack and interposer in accordance with another exemplary embodiment of the present disclosure.
Figure 4:
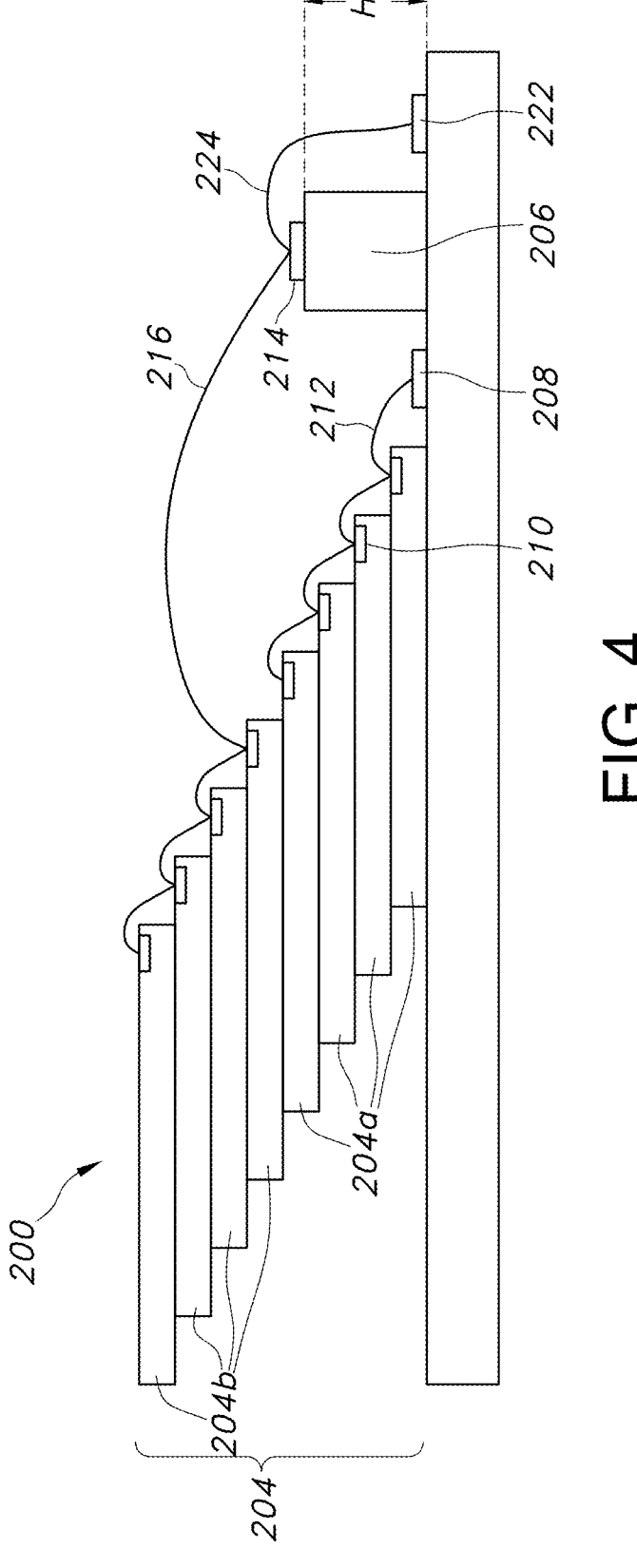
FIG. 4 is a side cross-sectional view of the portion of the semiconductor device package of FIG. 3.

Referring to FIGS. 3-4, there is shown a semiconductor device package, generally designated 200, in accordance with another exemplary embodiment of the present disclosure. The semiconductor device package 200 may be generally the same as package 100 except that package 200 may include a third set of bond pads 222 and a third set of bond wires 224 electrically connecting the second set of bond pads 214 to the substrate 202. The substrate 202 may be generally the same as substrate 102 except that there may be a third set of bond pads 222 electrically connected thereto. In some embodiments, the third set of bond pads 222 are exposed at a top surface 203 of the substrate 202. The bond pads included in the third set of bond pads 222 may be generally aligned with one another in at least one direction. For example, the bond pads of the second set of bond pads 222 may be arranged along a generally straight line or single column. In some such configurations, the centers of each of the bond pads in the third set may be substantially co-linear.

The semiconductor device package 200 may include a stack of memory dies 204 that are generally the same as memory dies 104 of package 100. Each memory die included in the stack 204 may include a die bonding pad 210 generally the same as die bonding pads 110. The pitch between the bond pads 210 may be generally the same as the pitch P between bond pads 110 as described above with reference to FIGS. 1-2. The stack of memory dies 204 may include a first sub-stack 204*a* and a second sub-stack 204*b* that are each generally the same as first and second sub-stacks 104*a*, 104*b*. The package 200 may include a first set of bond pads 208 and first set of bond wires 212 electrically connecting the first sub-stack 204*a* to the substrate 202 in generally the same manner as the first set of bond pads 108, and first set of bond wires 112 of package 100. In some embodiments, the memory dies of the first substack 204*a* are electrically isolated from the memory dies of the second substack 204*b*.

The second set of bond pads 224 may be coupled to the interposer 206 and spaced from the top surface 203 of the substrate 202 in generally the same manner as the second set of bond pads 114 of package 100. The interposer 206 may be similar to the interposer 106 of package 100 except that it may not provide an interface for the through-device vias 118. For example, the interposer 206 may not include openings or apertures for receiving the through-device vias 118. As such, the interposer 206 may not include any openings or apertures extending from the top surface of the interposer to the bottom surface. In some such embodiments, the interposer 206 may be a solid, monolithic block on which the second set of bond pads 224 are positioned. In some embodiments, interposer 206 may be formed from a single material, for example an electrically insulating ceramic or a dielectric material. The interposer 206 may be directly mounted on the top surface 203 of the substrate 202 instead of being coupled to the substrate via solder balls 119 as shown in FIG. 2A. In some such embodiments, the bottom surface of the interposer 206 may directly contact the substrate 202. As such, the interposer 206 may be mechanically coupled to the substrate 202 and electrically isolated therefrom. In some embodiments, the interposer 206 is coupled to the substrate 202 via adhesives or any other conventional method known to those skilled in the art. The interposer 206 may be the same height $H_1$ as the interposer 106. In some embodiments, the interposer 206 is comprised entirely of silicon, ceramic, or a combination thereof.

The second sub-stack of memory dies 204*b* may be electrically connected to the second set of bond pads 214 by a second set of bond wires 216 in generally the same manner as the second sub-stack of memory dies 104*b* of package 100. In some embodiments, at least a portion of the second set of bond wires 216 is positioned vertically above the first set of bond wires 212 and does not directly contact the first set of bond wires 212. The second set of bond pads 214 may be generally the same as the second set of bond pads 114, except that each bond pad may be electrically connected to the substrate 202 via a third set of bond wires 224. In some embodiments, the second set of bond pads 214 are the only bond pads on the interposer 206. For example, the third set of bond wires 224 may electrically connect the second set of bond pads 214 to the third set of bond pads 222. In this manner, the second sub-stack of memory dies 204*b* may be in electrical communication with the substrate 202. In some embodiments, the interposer 206 is positioned between the first and third sets of bond pads 208, 222. Similarly, the second set of bond pads 214 may be positioned between the first and third sets of bond pads 208, 222 and positioned above each by the height $H_1$ of the interposer 206. By providing the third set of bond pads 222 and third set of bond wires 224, the benefits of the package 100, as discussed above, may be achieved in generally the same manner except that the second set of bond pads 224 is electrically connected to the substrate 202 by the third set of bond wires 224 and third set of bond pads 222 instead of the through-device via 118 of package 100. In some embodiments, the first set of bond pads 208 are electrically isolated from the second set of bond pads 214. For example, in some embodiments, there are no bond wires that extend from the first set of bond pads 208 to the second set of bond pads 214 or from the first set of bond pads 208 to the third set of bond pads 222. In some embodiments, there are no bond wires that extend from the first set of bond pads 208 to the interposer 206. In some embodiments, no bond wires of the first set of bond wires 212 are connected to bond pads on the interposer 206. As such, in some embodiments, none of the memory dies of the first sub-stack 204*a* are electrically connected to the second set of bond pads 214. In some embodiments, none of the memory dies of the second substack 204*b* are electrically connected to the first set of bond pads 208.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right", "left", "lower" and "upper" designate directions in the drawings to which reference is made. Unless specifically set forth herein, the terms "a", "an" and "the" are not limited to one element but instead should be read as meaning "at least one". As used herein, the term "about" may refer to +/−10% of the value referenced. For example, "about 9" is understood to encompass 8.1 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. A semiconductor device package comprising:
   a substrate having a first set of bond pads electrically connected thereto;
   a stack of semiconductor dies including a first sub-stack of dies and a second sub-stack of dies, the second sub-stack of dies positioned above the first sub-stack of dies;
   an interposer positioned on the substrate and spaced from the stack of semiconductor dies;
   a second set of bond pads positioned on the interposer and electrically connected to the substrate by way of the interposer, wherein the second set of bond pads are positioned above the substrate;
   a first set of bond wires electrically connecting the first sub-stack of dies to the first set of bond pads; and
   a second set of bond wires electrically connecting the second sub-stack of dies to the second set of bond pads,
   wherein the second sub-stack of dies is electrically isolated from the first set of bond pads; and
   wherein the substrate includes a third set of bond pads,
   wherein the interposer is positioned between the first and third sets of bond pads, and
   wherein the semiconductor device package further comprises a third set of bond wires electrically connecting to the second set of bond pads to the third set of bond pads.

2. The semiconductor device package of claim 1, wherein the stacked semiconductor dies comprise memory dies, and the first sub-stack of memory dies and second sub-stack of memory dies are electrically isolated from one another.

3. The semiconductor device package of claim 1, wherein the first set of bond pads is positioned on the substrate between the stack of semiconductor dies and the interposer.

4. The semiconductor device package of claim 1, wherein the second set of bond pads are positioned above a top surface of the substrate by a height of at least 50 microns.

5. The semiconductor device package of claim 1, wherein a height of the interposer is at least five times a diameter of bond wires included in the first or second sets of bond wires.

6. The semiconductor device package of claim 1, wherein at least a portion of the second set of bond wires is positioned vertically above the first set of bond wires and does not directly contact the first set of bond wires.

7. The semiconductor device package of claim 1, wherein the interposer is comprised of a dielectric material.

8. The semiconductor device package of claim 1, wherein the second set of bond pads is electrically connected to the substrate by a through-device via in the interposer.

9. The semiconductor device package of claim 8 further comprising:

one or more solder balls physically coupling the interposer to the substrate and electrically connecting the through-device via to the substrate.

10. The semiconductor device package of claim 1, wherein the interposer is mounted directly on the substrate.

11. The semiconductor device package of claim 1, wherein each semiconductor die included in the stack of semiconductor dies includes a set of die bond pads, wherein the die bond pads of the first sub-stack of dies are electrically connected to the first set of bond pads by the first set of bond wires, and the die bond pads of the second sub-stack of dies are electrically connected to the second set of bond pads by the second set of bond wires.

12. A semiconductor memory package comprising:

a substrate including a top surface and a first set of bond pads exposed at the top surface;

an interposer positioned on and extending upwardly from the top surface of the substrate, the interposer including a second set of bond pads coupled to a top surface of the interposer;

a stack of staggered memory dies offset with respect to each other in a longitudinal direction and including a bottom sub-stack of memory dies and an upper sub-stack of memory dies;

a first plurality of bond wires electrically connecting the bottom sub-stack of memory dies to the first set of bond pads; and a second plurality of bond wires electrically connecting the upper sub-stack of memory dies to the second set of bond pads, wherein the bottom sub-stack of memory dies are not electrically connected to the second set of bond pads and the upper sub-stack of memory dies are not electrically connected to the first set of bond pads; and a third set of bond pads exposed at the top surface of the substrate, the interposer is positioned between the first and third sets of bond pads; and a third plurality of bond wires electrically connected to the second plurality of bond wires and the third set of bond pads, wherein the interposer is mounted directly on the substrate.

13. The semiconductor memory package of claim 12, wherein the first set of bond pads are positioned on the substrate between the stack of staggered memory dies and the interposer.

14. The semiconductor memory package of claim 12, wherein the top surface of the interposer is offset from the top surface of the substrate by a height of at least 50 microns as measured in a direction generally perpendicular to the top surface of the substrate.

15. The semiconductor device package of claim 12, wherein the top surface of the interposer is positioned between the top surface of the substrate and a top surface of an uppermost memory die included in the stack of staggered memory dies.

16. The semiconductor memory package of claim 12, wherein each memory die included in the stack of staggered memory dies has a set of die bond pads, wherein the die bond pads of the first sub-stack of memory dies are electrically connected to the first set of bond pads by the first plurality of bond wires, and the die bond pads of the second sub-stack of memory dies are electrically connected to the second set of bond pads by the second plurality of bond wires.

17. The semiconductor memory package of claim 12 further comprising:

one or more solder balls physically coupling the interposer to the substrate, wherein the one or more solder balls are electrically connected to the substrate; and a through-device via extending through the interposer and electrically connecting the second set of bond pads to the one or more solder balls.

18. A semiconductor device package comprising:

a substrate means for providing electrical interconnections between electrical components coupled to the substrate means, the substrate means including a first set of electrical contact means for transmitting and receiving a plurality of electrical signals;

a stack of storage means each for storing an amount of data, the stack of storage means including a first sub-stack of storage means and a second sub-stack of storage means positioned above the first sub-stack of storage means;

an interposer means for conveying electrical signals between the second sub-stack of storage means and the substrate means, the interposer means positioned on the substrate means and spaced from the stack of storage means;

a second set of electrical contact means for transmitting and receiving a plurality of electrical signals, the second set of electrical contact means being positioned on the interposer means and separated from the substrate means by a height of the interposer means;

a first set of electrical connection means for electrically connecting the first sub-stack of storage means to the first set of electrical contact means, the first set of electrical connection means electrically connected to the first sub-stack of storage means and to the first set of electrical contact means; and a second set of electrical connection means for electrically connecting the second sub-stack of storage means to the second set of electrical contact means, the second set of electrical connection means electrically connected to the second sub-stack of storage means and to the second set of electrical contact means, wherein the first sub-stack of storage means and the second sub-stack of storage means are electrically isolated from one another; and wherein the substrate means includes a third set of electrical contact means, wherein the interposer means is positioned between the first and third sets of electrical contact means, and wherein the semiconductor device package further comprises a third set of electrical connection means electrically connecting to the second set of electrical contact means to the third set of electrical contact means.

* * * * *